United States Patent
Togashi

(10) Patent No.: US 8,018,711 B2
(45) Date of Patent: Sep. 13, 2011

(54) FEEDTHROUGH CAPACITOR AND MOUNTED STRUCTURE THEREOF

(75) Inventor: Masaaki Togashi, Tokyo (JP)

(73) Assignee: TDK Corporation, Tokyo (JP)

(*) Notice: Subject to any disclaimer, the term of this patent is extended or adjusted under 35 U.S.C. 154(b) by 338 days.

(21) Appl. No.: 12/362,986

(22) Filed: Jan. 30, 2009

(65) Prior Publication Data

US 2009/0229871 A1   Sep. 17, 2009

(30) Foreign Application Priority Data

Mar. 14, 2008 (JP) ................. 2008-066411

(51) Int. Cl.
*H01G 4/005* (2006.01)
*H01G 4/228* (2006.01)
*H05K 1/16* (2006.01)

(52) U.S. Cl. ............... 361/303; 361/306.1; 361/306.3

(58) Field of Classification Search .......... 361/303, 361/302, 306.1, 306.2, 306.3, 305, 304, 311, 361/321.2, 312, 310, 309

See application file for complete search history.

(56) References Cited

U.S. PATENT DOCUMENTS

| 3,444,436 | A | * | 5/1969 | Nello ............................. 361/773 |
| 6,115,234 | A | * | 9/2000 | Ishii et al. ...................... 361/303 |
| 7,619,871 | B2 | | 11/2009 | Yoshida |
| 7,619,873 | B2 | | 11/2009 | Togashi |
| 7,623,337 | B2 | | 11/2009 | Togashi |
| 2009/0161289 | A1 | | 6/2009 | Yoshida |

FOREIGN PATENT DOCUMENTS

| CN | 101110295 A | 1/2008 |
| JP | U-58-191661 | 12/1983 |
| JP | U-59-180464 | 12/1984 |
| JP | A-1-206615 | 8/1989 |
| JP | U-3-73422 | 7/1991 |
| JP | 06176962 A | * 6/1994 |
| JP | A-11-102839 | 4/1999 |
| JP | A-2005-32900 | 2/2005 |
| JP | A-2008-21861 | 1/2008 |
| JP | A-2008-47833 | 2/2008 |

OTHER PUBLICATIONS

Translation of Japanese Office Action issued in Japanese Patent Application No. 2008-066411 mailed Aug. 17, 2010.
Jan. 26, 2010 Office Action issued in Japanese Patent Application No. P2008-066411.

* cited by examiner

*Primary Examiner* — Jayprakash N Gandhi
*Assistant Examiner* — Arun Ramaswamy
(74) *Attorney, Agent, or Firm* — Oliff & Berridge, PLC

(57) ABSTRACT

A feedthrough capacitor has: a capacitor element body of a substantially rectangular parallelepiped shape in which a plurality of insulator layers are laminated together; a signal internal electrode arranged in the capacitor element body; a ground internal electrode arranged in the capacitor element body and opposed to the signal internal electrode; signal terminal electrodes connected to the signal internal electrode; and a ground terminal electrode connected to the ground internal electrode. The signal terminal electrodes are provided on first and second end faces, respectively, in a longitudinal direction of the capacitor element body. The ground terminal electrode is provided on at least one side face out of first to fourth side faces extending along the longitudinal direction of the capacitor element body. Furthermore, the ground terminal electrode is located nearer at least one end face out of the first end face and the second end face.

5 Claims, 6 Drawing Sheets

FEEDTHROUGH CAPACITOR AND MOUNTED STRUCTURE THEREOF

BACKGROUND OF THE INVENTION

1. Field of the Invention

The present invention relates to a feedthrough capacitor and a mounted structure of the feedthrough capacitor.

2. Related Background Art

There is a hitherto-known feedthrough capacitor having a capacitor element body in which dielectric layers and internal electrodes are alternately laminated together, and terminal electrodes formed on the surface of the capacitor element body (e.g., Japanese Patent Application Laid-open No. 01-206615).

SUMMARY OF THE INVENTION

For reducing the impedance of the feedthrough capacitor, it is necessary to decrease the equivalent series inductance (ESL). Particularly, in order to achieve high-frequency operation, it is believed to be necessary to keep the ESL sufficiently low. However, nothing is considered for reduction in ESL with the feedthrough capacitor described in the foregoing Application Laid-open No. 01-206615.

Incidentally, products have been downsized in recent years and this trend leads to a demand for increase in wiring density on a circuit board. In the case of the feedthrough capacitor as described in the foregoing Laid-open No. 01-206615, when it is mounted on a circuit board, the wiring space is reduced thereby. For this reason, there is a possibility of reduction in the wiring density.

Therefore, an object of the present invention is to provide a feedthrough capacitor capable of preventing the reduction in the wiring density when mounted on a circuit board and achieving the reduction in ESL, and a mounted structure thereof The present invention provides a feedthrough capacitor comprising: a capacitor element body of a substantially rectangular parallelepiped shape in which a plurality of insulator layers are laminated together; a signal internal electrode and a ground internal electrode arranged in the capacitor element body and facing each other; signal terminal electrodes provided on first and second end faces, respectively, in a longitudinal direction of the capacitor element body and connected to the signal internal electrode; and a ground terminal electrode provided on at least one side face out of first to fourth side faces extending along the longitudinal direction of the capacitor element body, the ground terminal electrode being connected to the ground internal electrode, wherein the ground terminal electrode is located nearer at least one end face out of the first end face and the second end face.

In the feedthrough capacitor according to the present invention, the signal terminal electrodes are provided on the first and second end faces of the capacitor element body and the ground terminal electrode is on at least one of the first to fourth side faces of the capacitor element body. Since the ground terminal electrode is located nearer at least one end face of the first and second end faces, the ground terminal electrode lies near the signal terminal electrode. This configuration achieves reduction in ESL of the feedthrough capacitor.

The central portion of the first to fourth side faces is a region where no terminal electrode is formed. In this configuration, when the feedthrough capacitor is mounted on a circuit board, the space under the central portion of the feedthrough capacitor can be used as a wiring space. As a consequence, this configuration successfully prevents the reduction in the wiring density which can occur in mounting of the feedthrough capacitor C1.

Preferably, the ground terminal electrode comprises a ground terminal electrode located nearer the first end face and a ground terminal electrode located nearer the second end face, on at least one side face out of the first to fourth side faces, and, when viewed from a direction perpendicular to the side face on which the ground terminal electrodes are located, a distance between the ground terminal electrodes each located on the side face is longer than a distance between the ground terminal electrode located nearer the first end face, and the first end face and a distance between the ground terminal electrode located nearer the second end face, and the second end face.

In this case, since the ground terminal electrodes are located much newer the signal terminal electrodes, the ESL of the feedthrough capacitor is further reduced. The distance between the ground terminal electrodes is also relatively long, and the region with no terminal electrode becomes much wider in the central portion of the feedthrough capacitor In this configuration, when the feedthrough capacitor is mounted on a circuit board, a wider wiring space is ensured under the feedthrough capacitor and more wires can be set to pass under the feedthrough capacitor.

Preferably, the ground terminal electrode comprises a ground terminal electrode located nearer the first end face on the first side face and a ground terminal electrode located nearer the second end face on the second side face facing the first side face, and, when viewed from a facing direction of the first and second side faces, a distance between the ground terminal electrode located on the first side face and the ground terminal electrode located on the second side face is longer than a distance between the ground terminal electrode located nearer the first end face on the first side face, and the first end face and a distance between the ground terminal electrode located nearer the second end face on the second side face, and the second end face.

In this case, since the ground terminal electrodes are located much nearer the signal terminal electrodes, the ESL of the feedthrough capacitor is further reduced. The distance between the ground terminal electrodes is also relatively long and the region with no terminal electrode is much wider in the central portion of the feedthrough capacitor. In this configuration, when the feedthrough capacitor is mounted on a circuit board, a wider wiring space is ensured under the feedthrough capacitor and the reduction in the wiring density is more certainly prevented thereby.

Preferably, the feedthrough capacitor comprises a plurality of ground internal electrodes and ground terminal electrodes, and at least two ground internal electrodes out of the plurality of ground internal electrodes are connected to different ground terminal electrodes out of the plurality of ground terminal electrodes.

In this case, the feedthrough capacitor has at least two forming regions of capacitance components connected in parallel. These forming regions are connected in parallel. If capacitances of these forming regions are designed to be different from each other, we can obtain the feedthrough capacitor the impedance of which is set low over a wide band.

Preferably, the feedthrough capacitor comprises a plurality of signal internal electrodes, and at least one signal internal electrode out of the plurality of signal internal electrodes and at least one ground internal electrode out of the plurality of ground internal electrodes are arranged on the same layer.

In this case, since the signal internal electrode and the ground internal electrode are arranged on the same layer, the number of internal electrodes layers laminated is reduced thereby. As a consequence, the feedthrough capacitor can be formed with a lower profile.

The present invention provides a mounted structure of a feedthrough capacitor comprising: the feedthrough capacitor as set forth; and a circuit board having a conductor wire formed on a surface thereof, wherein the feedthrough capacitor is arranged above the conductor wire so that a longitudinal direction of the feedthrough capacitor intersects with an extending direction of the conductor wire.

In the case of the mounted structure of the feedthrough capacitor according to the present invention, when the feedthrough capacitor is mounted on the circuit board so that the longitudinal direction intersects with the extending direction of the conductor wire, the conductor wire is allowed to extend under the feedthrough capacitor, without occurrence of a short circuit between the signal terminal electrode and ground terminal electrodes of the feedthrough capacitor and the conductor wire. Therefore, the installation space of the feedthrough capacitor can be used as a wiring space, which prevents the reduction in the wiring density due to mounting of the feedthrough capacitor.

Preferably, the feedthrough capacitor has the ground terminal electrode located nearer the first end face and the ground terminal electrode located nearer the second end face, on at least one side face out of the first to fourth side faces, and, when viewed from a laminate direction of the insulator layers, a region located between the ground terminal electrode located nearer the first end face and the ground terminal electrode located nearer the second end face in the feedthrough capacitor is arranged above the conductor wire.

This configuration further lowers a probability of occurrence of a short circuit between the signal terminal electrode and ground terminal electrodes of the feedthrough capacitor and the conductor wire.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

The preferred embodiments of the present invention will be described below in detail with reference to the accompanying drawings. In the description, the same elements or elements with the same functionality will be denoted by the same reference symbols, without redundant description.

First Embodiment

Figure 1:
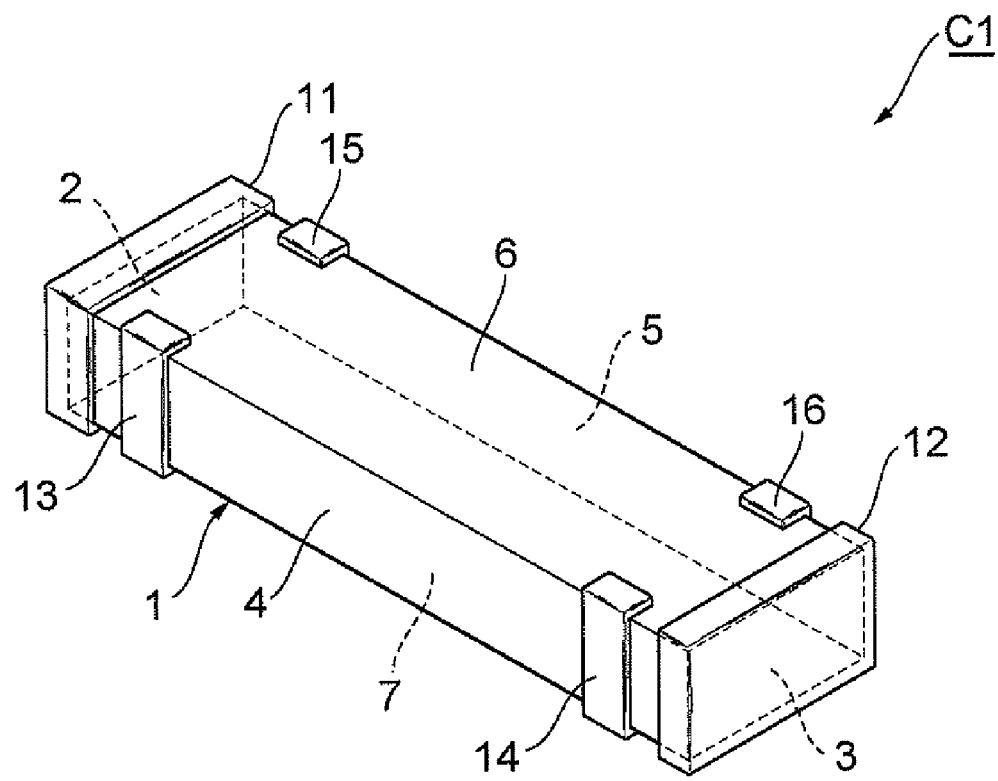
FIG. 1 is a perspective view of a feedthrough capacitor according to the first embodiment.
Figure 2:
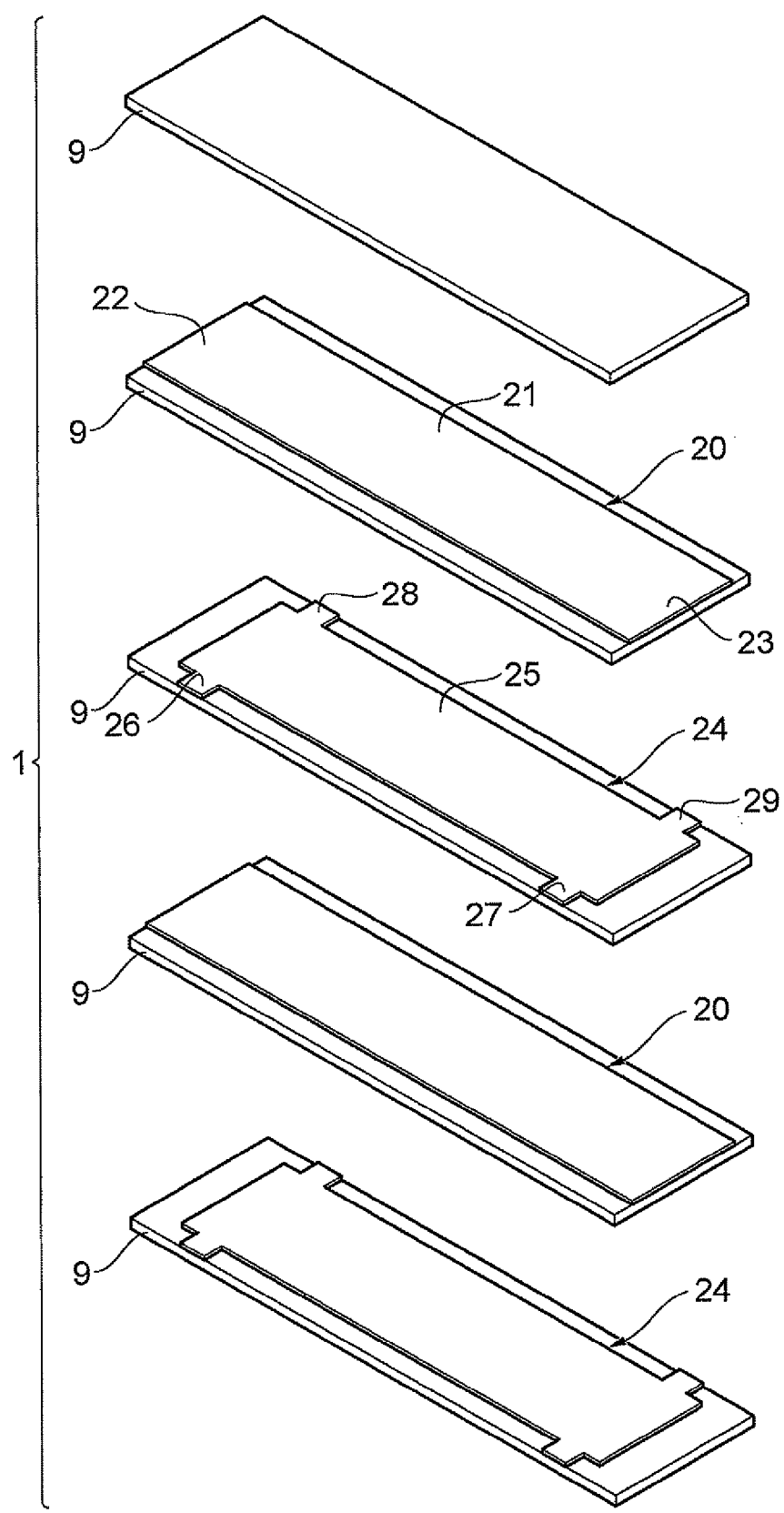
FIG. 2 is an exploded perspective view of a capacitor element body of the feedthrough capacitor according to the first embodiment.
Figure 3:
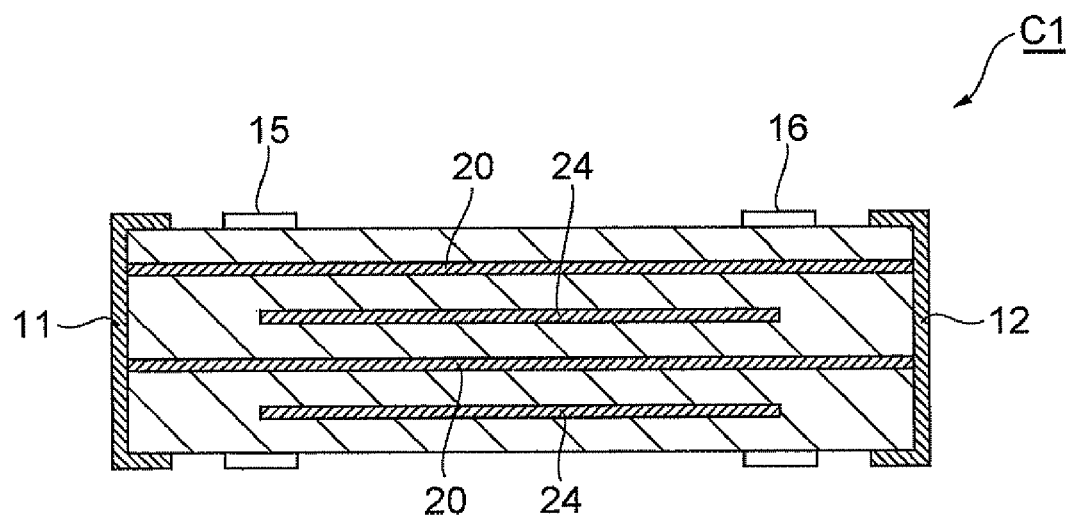
FIG. 3 is a sectional view of the feedthrough capacitor according to the first embodiment.
Figure 4:
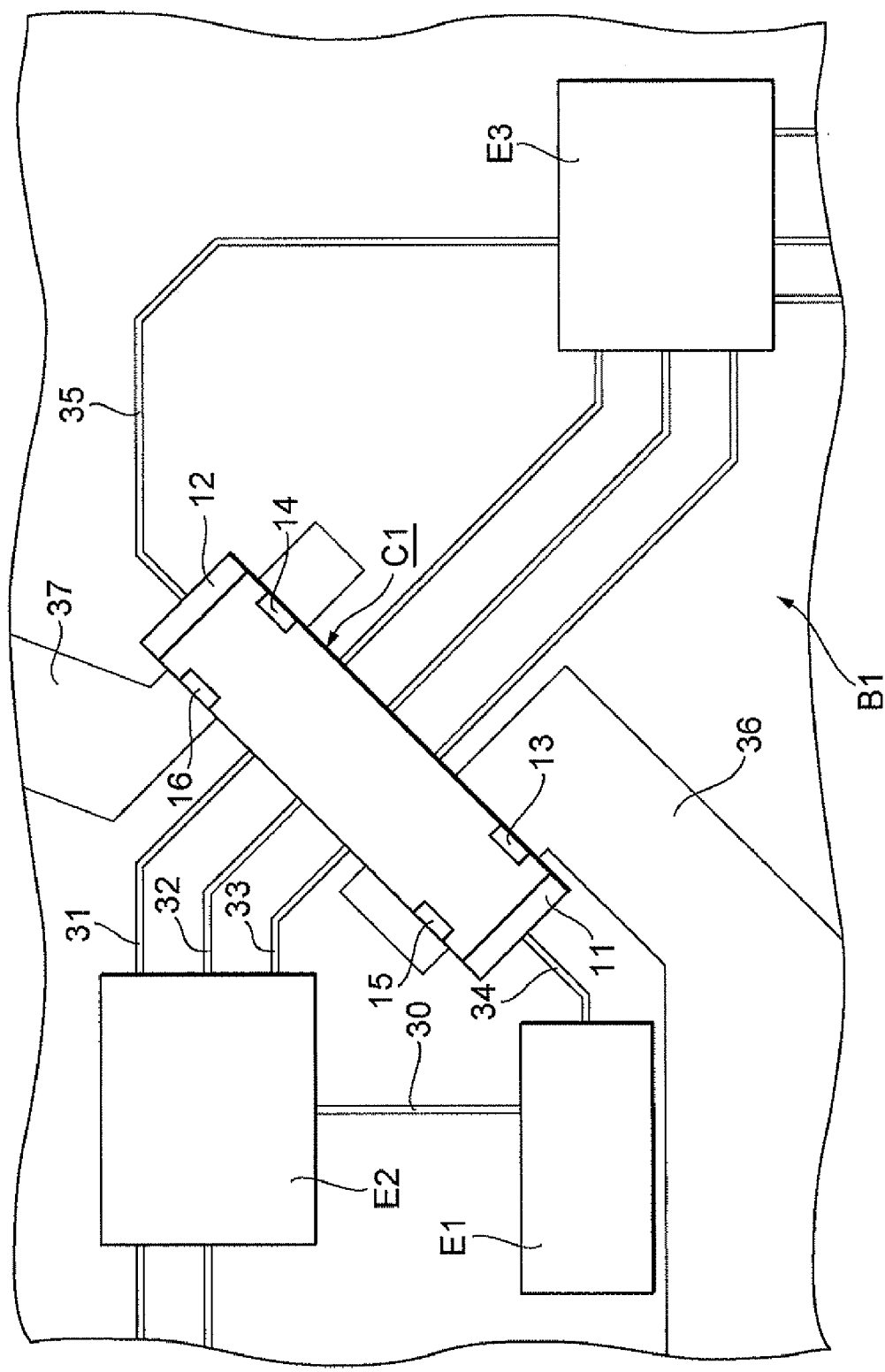
FIG. 4 is a top plan view of the feedthrough capacitor and a circuit board with the feedthrough capacitor thereon according to the first embodiment.

FIG. 1 is a perspective view of a feedthrough capacitor according to the first embodiment. FIG. 2 is an exploded perspective view of a capacitor element body of the feedthrough capacitor according to the first embodiment. FIG. 3 is a sectional view of the feedthrough capacitor according to the first embodiment. FIG. 4 is a top plan view of the feedthrough capacitor and a circuit board with the feedthrough capacitor thereon according to the first embodiment. In FIG. 4, for easier viewing of the drawing, solder portions between the feedthrough capacitor and the circuit board are omitted from the illustration.

As shown in FIG. 1, the feedthrough capacitor C1 of the present embodiment has a capacitor element body 1, first and second signal terminal electrodes 11, 12, and first to fourth ground terminal electrodes 13-16.

The capacitor element body 1 is of a nearly rectangular parallelepiped shape and has first and second end faces 2, 3, first and second side faces 4, 5, and third and fourth side faces 6, 7. The first and second end faces 2, 3 are perpendicular to the longitudinal direction and face each other. The first and second side faces 4, 5 extend in the longitudinal direction, connect between the first and second end faces 2, 3, and face each other. The third and fourth side faces 6, 7 extend in the longitudinal direction, connect between the first and second end faces 2, 3, and face each other. The third side face 6 or the fourth side face 7 is a principal surface in the capacitor element body 1 and becomes a mounting surface to another component (e.g., a circuit board, an electronic component, or the like).

The capacitor element body 1, as shown in FIG. 2, has a plurality of insulator layers 9. The capacitor element body 1 is constructed in a structure in which the plurality of insulator layers 9 are laminated together in a facing direction of the third and fourth side faces 6, 7, and has a dielectric property. Each insulator layer 9 is composed, for example, of a sintered body of a ceramic green sheet containing a dielectric ceramic (a dielectric ceramic of a $BaTiO_3$ type, $Ba(Ti, Zr)O_3$ type, or $(Ba, Ca)TiO_3$ type). The insulator layers 9 are integrally formed so that no border can be visually recognized between them in the practical feedthrough capacitor C1.

The first signal terminal electrode 11 is arranged on the first end face 2 of the capacitor element body 1. The first signal terminal electrode 11 is formed across the ends of the first to fourth side faces 4-7 (the ends on the first end face 2 side) so as to cover the entire area of the first end face 2. The second signal terminal electrode 12 is arranged on the second end face 3 of the capacitor element body 1. The second signal terminal electrode 12 is formed across the ends of the first to fourth side faces 4-7 (the ends on the second end face 3 side) so as to cover the entire area of the second end face 3. The first signal terminal electrode 11 and the second signal terminal electrode 12 face each other in the facing direction of the first and second end faces 2, 3 (the longitudinal direction).

The first ground terminal electrode 13 is arranged on the first side face 4 of the capacitor element body 1. The first ground terminal electrode 13 is formed between and partly on the third and fourth side faces 6, 7 so as to cover a part of the first side face 4 along the facing direction of the third and fourth side faces 6, 7. The first ground terminal electrode 13 is located nearer the first end face 2 on the first side face 4.

The second ground terminal electrode 14 is arranged on the first side face 4 of the capacitor element body 1. The second ground terminal electrode 14 is formed between and partly on the third and fourth side faces 6, 7 so as to cover a part of the first side face 4 along the facing direction of the third and fourth side faces 6, 7. The second ground terminal electrode 14 is located nearer the second end face 3 on the first side face 4.

The third ground terminal electrode 15 is arranged on the second side face 5 of the capacitor element body 1. The third ground terminal electrode 15 is formed between and partly on the third and fourth side faces 6, 7 so as to cover a part of the second side face 5 along the facing direction of the third and fourth side faces 6, 7. The third ground terminal electrode 15 is located nearer the first end face 2 on the second side face 5. The third ground terminal electrode 15 faces the first ground terminal electrode 13 in the facing direction of the first and second side faces 4, 5.

The fourth ground terminal electrode 16 is arranged on the second side face 5 of the capacitor element body 1. The fourth ground terminal electrode 16 is formed between and partly on the third and fourth side faces 6, 7 so as to cover a part of the second side face 5 along the facing direction of the third and fourth side faces 6, 7. The fourth ground terminal electrode 16 is located nearer the second end face 3 on the second side face 5. The fourth ground terminal electrode 16 faces the second ground terminal electrode 14 in the facing direction of the first and second side faces 4, 5.

As also seen from FIG. 4, the distance between the first ground terminal electrode 13 and the second ground terminal electrode 14 is longer than the distance between the first ground terminal electrode 13 and the first end face 2. The distance between the first ground terminal electrode 13 and the second ground terminal electrode 14 is longer than the distance between the second ground terminal electrode 14 and the second end face 3. The distance between the third ground terminal electrode 15 and the fourth ground terminal electrode 16 is longer than the distance between the third ground terminal electrode 15 and the first end face 2. The distance between the third ground terminal electrode 15 and the fourth ground terminal electrode 16 is longer than the distance between the fourth ground terminal electrode 16 and the second end face 3.

The first and second signal terminal electrodes 11, 12 and the first to fourth ground terminal electrodes 13-16 are formed, for example, by applying an electroconductive paste containing electroconductive metal powder and glass frit, onto the exterior surface of the capacitor element body 1 and sintering it. A plated layer may be formed on the first and second signal terminal electrodes 11, 12 and on the first to fourth ground terminal electrodes 13-16 after sintered, as occasion may demand.

The feedthrough capacitor C1, as shown in FIGS. 2 and 3, has a plurality of (two in the present embodiment) signal internal electrodes 20 and a plurality of (two in the present embodiment) ground internal electrodes 24. The signal internal electrodes 20 and the ground internal electrodes 24 are arranged at different positions (layers) in the facing direction of the third and fourth side faces 6, 7. Namely, the signal internal electrodes 20 and the ground internal electrodes 24 are arranged in the order of signal internal electrode 20, ground internal electrode 24, signal internal electrode 20, and ground internal electrode 24 and at intervals in the facing direction of the third and fourth side faces 6, 7 in the capacitor element body 1. The signal internal electrodes 20 and the ground internal electrodes 24 are arranged in the capacitor element body 1.

The signal internal electrodes 20 and the ground internal electrodes 24 are made of an electroconductive material (e.g., a base metal Ni or the like) usually used as internal electrodes of a multilayer electric element. Each of the signal internal electrodes 20 and the ground internal electrodes 24 is composed of a sintered body of an electroconductive paste containing the foregoing electroconductive material.

Each signal internal electrode 20 is of a nearly rectangular shape and has a main electrode portion 21 and lead portions 22, 23. The main electrode portion 21 and the lead portions 22, 23 are integrally formed. The lead portion 22 extends from the edge of the main electrode portion 21 on the first end face 2 side so that the end thereof is exposed in the first end face 2. The lead portion 23 extends from the edge of the main electrode portion 21 on the second end face 3 side so that the end thereof is exposed in the second end face 3.

The aforementioned first signal terminal electrode 11 is formed so as to cover the entire part of the lead portion 22 exposed in the first end face 2, and the lead portion 22 is physically and electrically connected to the first signal terminal electrode 11. The second signal terminal electrode 12 is formed so as to cover the entire part of the lead portion 23 exposed in the second end face 3, and the lead portion 23 is physically and electrically connected to the second signal terminal electrode 12. These result in connecting the signal internal electrode 20 to the first and second signal terminal electrodes 11, 12.

The ground internal electrode 24 has a main electrode portion 25 of a nearly rectangular shape, and lead portions 26-29. The main electrode portion 25 and the lead portions 26-29 are integrally formed. The lead portions 26, 27 extend from the edge of the main electrode portion 25 on the first side face 4 side so that the end thereof is exposed in the first side face 4. The lead portion 26 is located nearer the first end face 2 and the lead portion 27 is located nearer the second end face 3. The lead portions 28, 29 extend from the edge of the main electrode portion 25 on the second side face 5 side so that the end thereof is exposed in the second side face 5. The lead portion 28 is located nearer the first end face 2 and the lead portion 29 is located nearer the second end face 3.

The aforementioned first ground terminal electrode 13 is formed so as to cover the entire part of the lead portion 26 exposed in the first side face 4, and the lead portion 26 is physically and electrically connected to the first ground terminal electrode 13. The second ground terminal electrode 14 is formed so as to cover the entire part of the lead portion 27 exposed in the first side face 4, and the lead portion 27 is physically and electrically connected to the second ground terminal electrode 14. The third ground terminal electrode 15 is formed so as to cover the entire part of the lead portion 28 exposed in the second side face 5, and the lead portion 28 is physically and electrically connected to the third ground terminal electrode 15. The fourth ground terminal electrode 16 is formed so as to cover the entire part of the lead portion 29 exposed in the second side face 5, and the lead portion 29 is physically and electrically connected to the fourth ground terminal electrode 16. These result in connecting the ground internal electrode 24 to the first to fourth ground terminal electrodes 13-16.

The main electrode portion 21 of the signal internal electrode 20 and the main electrode portion 25 of the ground internal electrode 24 include respective regions that face each other in the laminate direction of the insulator layers 9 with at least one insulator layer 9 as a part of the capacitor element body 1 in between. Namely, the signal internal electrode 20 and the ground internal electrode 24 have the regions overlapping with each other when viewed from the facing direction of the third and fourth side faces 6, 7. Therefore, an overlap portion of the insulator layer 9 with the main electrode portion 21 of the signal internal electrode 20 and with the main electrode portion 25 of the ground internal electrode 24 becomes a region that substantially produces a capacitance component.

The feedthrough capacitor C1 having the above-described configuration is mounted on a circuit board B1 as shown in FIG. 4. The circuit board B1 is a circuit board having conductor wires 30-37 formed on a surface thereof and semiconductor elements E1-E3, as well as the feedthrough capacitor C1, mounted thereon. The semiconductor elements E1, E2 are connected by the conductor wire 30 and the semiconductor elements E2, E3 are connected by the conductor wires 31-33. The semiconductor element E1 and the first signal terminal electrode 11 of the feedthrough capacitor C1 are connected by the conductor wire 34 and the semiconductor element E3 and the second signal terminal electrode 12 of the feedthrough capacitor C1 are connected by the conductor wire 35. The first and third ground terminal electrodes 13, 15 of the feedthrough capacitor C1 are connected to the conductor wire 36 and the second and fourth ground terminal electrodes 14, 16 of the feedthrough capacitor C1 are connected to the conductor wire 37. The conductor wires 30, 34, 35 are power supply lines and the conductor wires 36, 37 are ground lines. The conductor wires 31-33 are signal transmission lines between the semiconductor elements E2, E3, are adjacent to each other, and extend partly in the same direction.

The feedthrough capacitor C1 is arranged above the conductor wires 31-33 so that the facing direction of the first and second end faces 2, 3 (the longitudinal direction) intersects with the extending direction of the conductor wires 31-33. When viewed from the facing direction of the third and fourth side faces 6, 7, the conductor wires 31-33 pass between the first and second ground terminal electrodes 13, 14 of the feedthrough capacitor C1 and pass between the third and fourth ground terminal electrodes 15, 16 of the feedthrough capacitor C1.

In the present embodiment, as described above, the first and second signal terminal electrodes 11, 12 are provided on the first and second end faces 2, 3 of the capacitor element body 1 and the first to fourth ground terminal electrodes 13-16 are on the first to fourth side faces 4-7 of the capacitor element body 1. The first and third ground terminal electrodes 13, 15 are provided nearer the first end face 2 and the second and fourth ground terminal electrodes 14, 16 are provided nearer the second end face 3; hence, the first to fourth ground terminal electrodes 13-16 are located near the first and second signal terminal electrodes 11, 12. Therefore, the present embodiment successfully achieves the reduction in ESL of the feedthrough capacitor C1.

The central portion of the first to fourth side faces 4-7 is a region without the ground terminal electrodes. Therefore, when the feedthrough capacitor C1 is mounted on the circuit board B1, the space under the central portion of the feedthrough capacitor C1 can be used as a wiring space, which can prevent the reduction in the wiring density possibly occurring in mounting of the feedthrough capacitor C1.

In the present embodiment, the distance between the first ground terminal electrode 13 and the second ground terminal electrode 14 is longer than the distance between the first ground terminal electrode 13 and the first end face 2 and the distance between the second ground terminal electrode 14 and the second end face 3. The distance between the third ground terminal electrode 15 and the fourth ground terminal electrode 16 is longer than the distance between the third ground terminal electrode 15 and the first end face 2 and the distance between the fourth ground terminal electrode 16 and the second end face 3. This configuration makes the first to fourth ground terminal electrodes 13-16 located much nearer the first and second signal terminal electrodes 11, 12, which can achieve further reduction in ESL of the feedthrough capacitor C1.

Since the spacing between the first ground terminal electrode 13 and the second ground terminal electrode 14 and the spacing between the third ground terminal electrode 15 and the fourth ground terminal electrode 16 are much wider, the region without the ground terminal electrodes in the central portion of the feedthrough capacitor C1 is also much wider. Therefore, when this feedthrough capacitor C1 is mounted on the circuit board B1, a wider wiring space is ensured under the feedthrough capacitor C1 and more wires can be set to run under the feedthrough capacitor C1.

Second Embodiment

Figure 5:
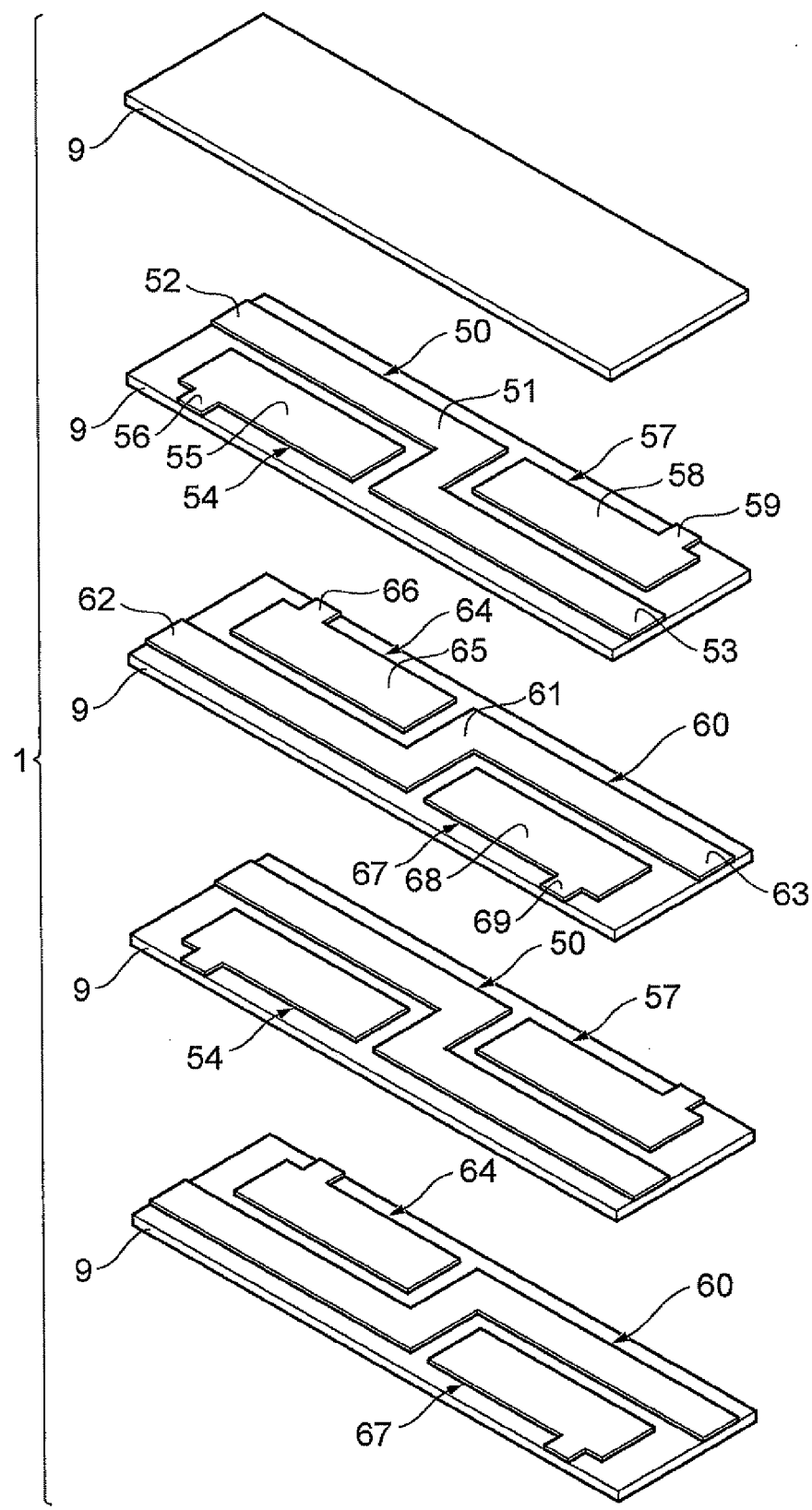
FIG. 5 is an exploded perspective view of a capacitor element body of a feedthrough capacitor according to the second embodiment.

Next, the feedthrough capacitor of the second embodiment will be described. The feedthrough capacitor of the second embodiment is different in the shapes and arrangement of the signal internal electrodes and ground internal electrodes from the feedthrough capacitor C1 of the first embodiment. FIG. 5 is an exploded perspective view of the capacitor element body of the feedthrough capacitor according to the second embodiment.

The feedthrough capacitor of the second embodiment has the capacitor element body 1, first and second signal terminal electrodes 11, 12, and first to fourth ground terminal electrodes 13-16, which are not shown herein, as the feedthrough capacitor C1 of the first embodiment. The feedthrough capacitor of the second embodiment can also be mounted on the circuit board B1 shown in FIG. 4, as the feedthrough capacitor C1 of the first embodiment.

As shown in FIG. 5, the feedthrough capacitor of the second embodiment has a plurality of (two in the present embodiment) first signal internal electrodes 50, a plurality of (two in the present embodiment) second signal internal electrodes 60, a plurality of (two in the present embodiment) first ground internal electrodes 54, a plurality of (two in the present embodiment) second ground internal electrodes 57, a plurality of (two in the present embodiment) third ground internal electrodes 64, and a plurality of (two in the present embodiment) fourth ground internal electrodes 67. The first and second signal internal electrodes 50, 60 and the first to fourth ground internal electrodes 54, 57, 64, 67 are arranged in the capacitor element body 1.

The first signal internal electrodes 50 and the second signal internal electrodes 60 are arranged at different positions (layers) in the facing direction of the third and fourth side faces 6, 7. The first signal internal electrode 50 and the first and second ground internal electrodes 54, 57 are arranged each at the same position (layer) in the facing direction of the third and fourth side faces 6, 7. The second signal internal electrode 60 and the third and fourth ground internal electrodes 64, 67 are arranged each at the same position (layer) in the facing direction of the third and fourth side faces 6, 7.

The first and second signal internal electrodes 50, 60 and the first to fourth ground internal electrodes 54, 57, 64, 67 are made of an electroconductive material (e.g., a base metal Ni or the like) usually used as internal electrodes of a multilayer electric element. Each of the first and second signal internal electrodes 50, 60 and the first to fourth ground internal electrodes 54, 57, 64, 67 is composed of a sintered body of an electroconductive paste containing the foregoing electroconductive material.

Each first signal internal electrode 50 is of a crank shape and has a main electrode portion 51 and lead portions 52, 53. The main electrode portion 51 and the lead portions 52, 53 are integrally formed. The lead portion 52 extends from the edge of the main electrode portion 51 on the first end face 2 side so that the end thereof is exposed in the first end face 2. The lead portion 53 extends from the edge of the main electrode portion 51 on the second end face 3 side so that the end thereof is exposed in the second end face 3.

Each second signal internal electrode 60 is of a crank shape and has a main electrode portion 61 and lead portions 62, 63. The main electrode portion 61 and the lead portions 62, 63 are integrally formed. The lead portion 62 extends from the edge of the main electrode portion 61 on the first end face 2 side so that the end thereof is exposed in the first end face 2. The lead portion 63 extends from the edge of the main electrode portion 61 on the second end face 3 side so that the end thereof is exposed in the second end face 3.

The first signal terminal electrode 11 is formed so as to cover the entire parts of the lead portions 52, 62 exposed in the first end face 2, and the lead portions 52, 62 are physically and electrically connected to the first signal terminal electrode 11. The second signal terminal electrode 12 is formed so as to cover the entire parts of the lead portions 53, 63 exposed in the second end face 3, and the lead portions 53, 63 are physically and electrically connected to the second signal terminal electrode 12. These result in connecting the first and second signal internal electrodes 50, 60 to the first and second signal terminal electrodes 11, 12.

Each first ground internal electrode 54 is located between the first signal internal electrode 50 and the first side face 4. The first ground internal electrode 54 has a main electrode portion 55 of a nearly rectangular shape and a lead portion 56. The main electrode portion 55 and the lead portion 56 are integrally formed. The lead portion 56 extends from the edge of the main electrode portion 55 on the first side face 4 side so that the end thereof is exposed in the first side face 4. The lead portion 56 is located nearer the first end face 2.

Each second ground internal electrode 57 is located between the first signal internal electrode 50 and the second side face 5. The second ground internal electrode 57 has a main electrode portion 58 of a nearly rectangular shape and a lead portion 59. The main electrode portion 58 and the lead portion 59 are integrally formed. The lead portion 59 extends from the edge of the main electrode portion 58 on the second side face 5 side so that the end thereof is exposed in the second side face 5. The lead portion 59 is located nearer the second end face 3.

Each third ground internal electrode 64 is located between the second signal internal electrode 60 and the second side face 5. The third ground internal electrode 64 has a main electrode portion 65 of a nearly rectangular shape and a lead portion 66. The main electrode portion 65 and the lead portion 66 are integrally formed. The lead portion 66 extends from the edge of the main electrode portion 65 on the second side face 5 side so that the end thereof is exposed in the second side face 5. The lead portion 66 is located nearer the first end face 2.

Each fourth ground internal electrode 67 is located between the second signal internal electrode 60 and the first side face 4. The fourth ground internal electrode 67 has a main electrode portion 68 of a nearly rectangular shape and a lead portion 69. The main electrode portion 68 and the lead portion 69 are integrally formed. The lead portion 69 extends from the edge of the main electrode portion 68 on the first side face 4 side so that the end thereof is exposed in the first side face 4. The lead portion 69 is located nearer the second end face 3.

The first ground terminal electrode 13 is formed so as to cover the entire parts of the lead portions 56 exposed in the first side face 4, and the lead portions 56 are physically and electrically connected to the first ground terminal electrode 13. The second ground terminal electrode 14 is formed so as to cover the entire parts of the lead portions 69 exposed in the first side face 4, and the lead portions 69 are physically and electrically connected to the second ground terminal electrode 14. The third ground terminal electrode 15 is formed so as to cover the entire parts of the lead portions 66 exposed in the second side face 5, and the lead portions 66 are physically and electrically connected to the third ground terminal electrode 15. The fourth ground terminal electrode 16 is formed so as to cover the entire parts of the lead portions 59 exposed in the second side face 5, and the lead portions 59 are physically and electrically connected to the fourth ground terminal electrode 16. These result in connecting the first ground internal electrodes 54 to the first ground terminal electrode 13, connecting the second ground internal electrodes 57 to the fourth ground terminal electrode 16, connecting the third ground internal electrodes 64 to the third ground terminal electrode 15, and connecting the fourth ground internal electrodes 67 to the second ground terminal electrode 14.

The main electrode portion 51 of the first signal internal electrode 50 and the main electrode portions 65, 68 of the third and fourth ground internal electrodes 64, 67 include regions that face each other in the laminate direction of the insulator layers 9 with at least one insulator layer 9 as a part of the capacitor element body 1 in between. Namely, the first signal internal electrode 50 and the third and fourth ground internal electrodes 64, 67 have respective regions overlapping with each other when viewed from the facing direction of the third and fourth side faces 6, 7. Therefore, an overlap portion of the insulator layer 9 with the main electrode portion 51 of the first signal internal electrode 50 and with the main electrode portion 65 of the third ground internal electrode 64 and an overlap portion of the insulator layer 9 with the main electrode portion 51 of the first signal internal electrode 50 and with the main electrode portion 68 of the fourth ground internal electrode 67 become regions that substantially produce respective capacitance components.

The main electrode portion 61 of the second signal internal electrode 60 and the main electrode portions 55, 58 of the first and second ground internal electrodes 54, 57 include regions that face each other in the laminate direction of the insulator layers 9 with at least one insulator layer 9 as a part of the capacitor element body 1 in between. Namely, the second signal internal electrode 60 and the first and second ground internal electrodes 54, 57 have regions overlapping with each other when viewed from the facing direction of the third and fourth side faces 6, 7. Therefore, an overlap portion of the insulator layer 9 with the main electrode portion 61 of the second signal internal electrode 60 and with the main electrode portion 55 of the first ground internal electrode 54 and an overlap portion of the insulator layer 9 with the main electrode portion 61 of the second signal internal electrode 60 and with the main electrode portion 58 of the second ground internal electrode 57 are regions that substantially produce respective capacitance components.

In the feedthrough capacitor of the second embodiment, the overlap portion of the insulator layer 9 with the main electrode portion 51 and the main electrode portion 65, the overlap portion of the insulator layer 9 with the main electrode portion 51 and the main electrode portion 68, the overlap portion of the insulator layer 9 with the main electrode portion 61 and the main electrode portion 55, and the overlap portion of the insulator layer 9 with the main electrode portion 61 and the main electrode portion 58 are the regions substantially producing their respective capacitance components. Therefore, the feedthrough capacitor of the second embodiment has four types of regions substantially producing the capacitance components.

The feedthrough capacitor of the second embodiment having the above-described configuration also successfully achieves the reduction in ESL of the feedthrough capacitor for the same reason as in the case of the feedthrough capacitor C1 of the first embodiment. It also suppresses the reduction in the wiring density possibly occurring when the feedthrough capacitor of the second embodiment is mounted on the circuit board B1.

The feedthrough capacitor of the second embodiment has the four types of regions substantially producing the capacitance components and these four types of regions are connected in parallel. Therefore, the feedthrough capacitor can be obtained with low impedance over a wide band when the capacitances are designed at different values by adjusting the sizes and shapes of these four types of regions.

Third Embodiment

Figure 6:
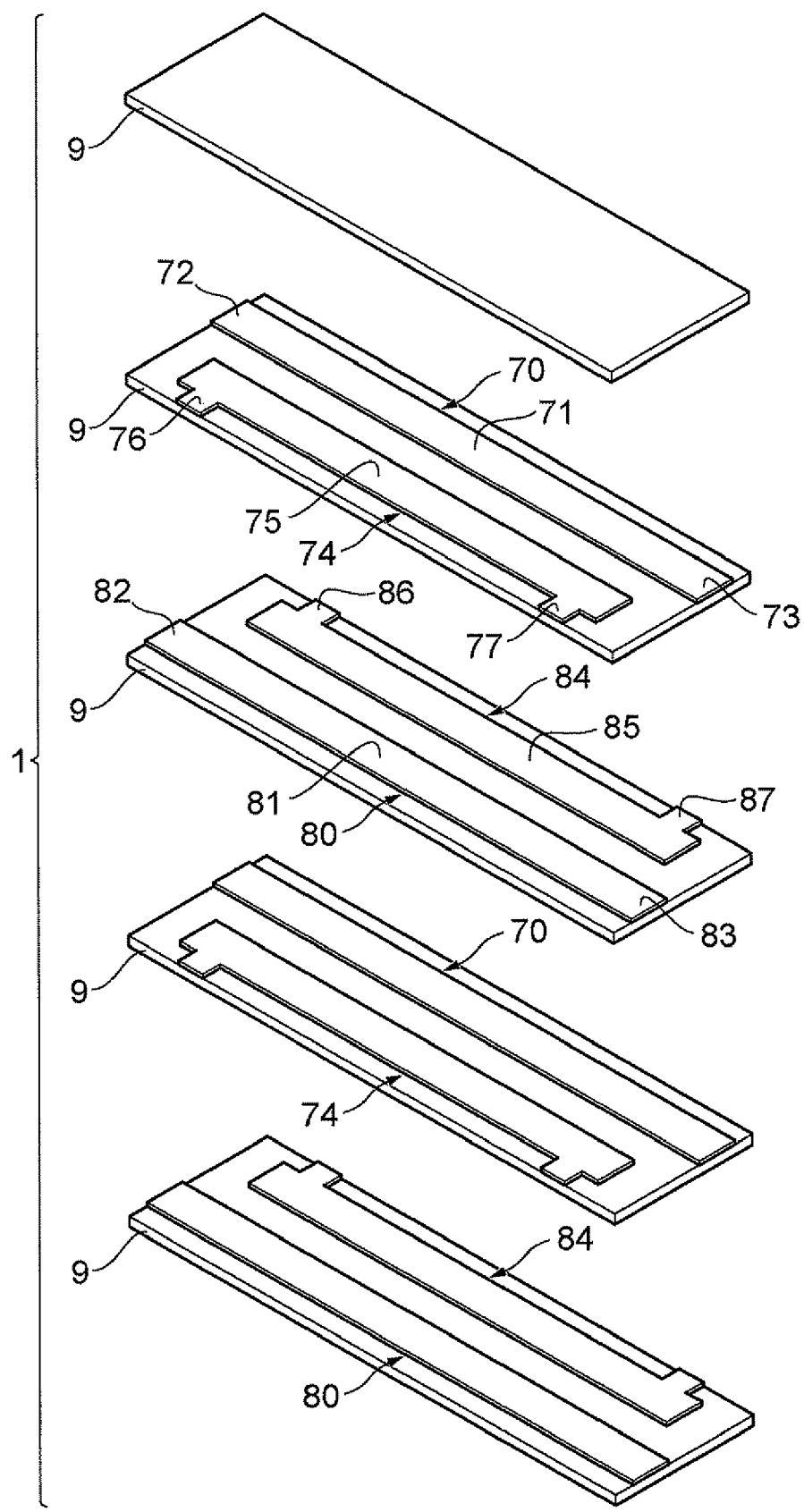
FIG. 6 is an exploded perspective view of a capacitor element body of a feedthrough capacitor according to the third embodiment.

Next, the feedthrough capacitor of the third embodiment will be described. The feedthrough capacitor of the third embodiment is different in the shapes and arrangement of the signal internal electrodes and the ground internal electrodes from the feedthrough capacitors of the first and second embodiments. FIG. 6 is an exploded perspective view of the capacitor element body of the feedthrough capacitor according to the third embodiment.

The feedthrough capacitor of the third embodiment also has the capacitor element body 1, first and second signal terminal electrodes 11, 12, and first to fourth ground terminal electrodes 13-16, which are not shown herein, as the feedthrough capacitor C1 of the first embodiment. The feedthrough capacitor of the third embodiment can also be mounted on the circuit board B1 shown in FIG. 4, as the feedthrough capacitor C1 of the first embodiment.

As shown in FIG. 6, the feedthrough capacitor of the third embodiment has a plurality of (two in the present embodiment) first signal internal electrodes 70, a plurality of (two in the present embodiment) second signal internal electrodes 80, a plurality of (two in the present embodiment) first ground internal electrodes 74, and a plurality of (two in the present embodiment) second ground internal electrodes 84. The first and second signal internal electrodes 70, 80 and the first and second ground internal electrodes 74, 84 are arranged in the capacitor element body 1.

The first signal internal electrodes 70 and the second signal internal electrodes 80 are arranged at different positions (layers) in the facing direction of the third and fourth side faces 6, 7. The first signal internal electrode 70 and the first ground internal electrode 74 are arranged at the same position (layer) in the facing direction of the third and fourth side faces 6, 7. The second signal internal electrode 80 and the second ground internal electrode 84 are arranged at the same position (layer) in the facing direction of the third and fourth side faces 6, 7.

The first and second signal internal electrodes 70, 80 and the first and second ground internal electrodes 74, 84 are made of an electroconductive material (e.g., a base metal Ni or the like) usually used as internal electrodes of a multilayer electric element. Each of the first and second signal internal electrodes 70, 80 and the first and second ground internal electrodes 74, 84 is composed of a sintered body of an electroconductive paste containing the foregoing electroconductive material.

Each first signal internal electrode 70 is of a nearly rectangular shape and has a main electrode portion 71 and lead portions 72, 73. The main electrode portion 71 and the lead portions 72, 73 are integrally formed. The lead portion 72 extends from the edge of the main electrode portion 71 on the first end face 2 side so that the end thereof is exposed in the first end face 2. The lead portion 73 extends from the edge of the main electrode portion 71 on the second end face 3 side so that the end thereof is exposed in the second end face 3.

Each second signal internal electrode 80 is of a nearly rectangular shape and has a main electrode portion 81 and lead portions 82, 83. The main electrode portion 81 and the lead portions 82, 83 are integrally formed. The lead portion 82 extends from the edge of the main electrode portion 81 on the first end face 2 side so that the end thereof is exposed in the first end face 2. The lead portion 83 extends from the edge of the main electrode portion 81 on the second end face 3 side so that the end thereof is exposed in the second end face 3.

The first signal terminal electrode 11 is formed so as to cover the entire parts of the lead portions 72, 82 exposed in the first end face 2, and the lead portions 72, 82 are physically and electrically connected to the first signal terminal electrode 11. The second signal terminal electrode 12 is formed so as to cover the entire parts of the lead portions 73, 83 exposed in the second end face 3, and the lead portions 73, 83 are physically and electrically connected to the second signal terminal electrode 12. These result in connecting the first and second signal internal electrodes 70, 80 to the first and second signal terminal electrodes 11, 12.

Each first ground internal electrode 74 is located between the first signal internal electrode 70 and the first side face 4. The first ground internal electrode 74 has a main electrode portion 75 of a nearly rectangular shape and lead portions 76, 77. The main electrode portion 75 and the lead portions 76, 77 are integrally formed. The lead portions 76, 77 extend from the edge of the main electrode portion 75 on the first side face 4 side so that the end thereof is exposed in the first side face 4. The lead portion 76 is located nearer the first end face 2 and the lead portion 77 is located nearer the second end face 3.

Each second ground internal electrode 84 is located between the second signal internal electrode 80 and the second side face 5. The second ground internal electrode 84 has a main electrode portion 85 of a nearly rectangular shape and lead portions 86, 87. The main electrode portion 85 and the lead portions 86, 87 are integrally formed. The lead portions 86, 87 extend from the edge of the main electrode portion 85 on the second side face 5 side so that the end thereof is exposed in the second side face 5. The lead portion 86 is located nearer the first end face 2 and the lead portion 87 is located nearer the second end face 3.

The first ground terminal electrode 13 is formed so as to cover the entire parts of the lead portions 76 exposed in the first side face 4, and the lead portions 76 are physically and electrically connected to the first ground terminal electrode 13. The second ground terminal electrode 14 is formed so as to cover the entire parts of the lead portions 77 exposed in the first side face 4, and the lead portions 77 are physically and electrically connected to the second ground terminal electrode 14. The third ground terminal electrode 15 is formed so as to cover the entire parts of the lead portions 86 exposed in the second side face 5, and the lead portions 86 are physically and electrically connected to the third ground terminal electrode 15. The fourth ground terminal electrode 16 is formed so as to cover the entire parts of the lead portions 87 exposed in the second side face 5, and the lead portions 87 are physically and electrically connected to the fourth ground terminal electrode 16. These result in connecting the first ground internal electrodes 74 to the first and second ground terminal electrodes 13, 14 and connecting the second ground internal electrodes 84 to the third and fourth ground terminal electrodes 15, 16

The main electrode portion 71 of the first signal internal electrode 70 and the main electrode portion 85 of the second ground internal electrode 84 include regions that face each other in the laminate direction of the insulator layers 9 with at least one insulator layer 9 as a part of the capacitor element body 1 in between. Namely, the first signal internal electrode 70 and the second ground internal electrode 84 have respective regions overlapping with each other when viewed from the facing direction of the third and fourth side faces 6, 7. Namely, an overlap portion of the insulator layer 9 with the main electrode portion 71 of the first signal internal electrode 70 and with the main electrode portion 85 of the second ground internal electrode 84 becomes a region substantially producing a capacitance component.

The main electrode portion 81 of the second signal internal electrode 80 and the main electrode portion 75 of the first ground internal electrode 74 include regions that face each other in the laminate direction of the insulator layers 9 with at least one insulator layer 9 as a part of the capacitor element body 1 in between. Namely, the second signal internal electrode 80 and the first ground internal electrode 74 have respective regions overlapping with each other when viewed from the facing direction of the third and fourth side faces 6, 7. Therefore, an overlap portion of the insulator layer 9 with the main electrode portion 81 of the second signal internal electrode 80 and with the main electrode portion 75 of the first ground internal electrode 74 becomes a region substantially producing a capacitance component.

In the feedthrough capacitor of the third embodiment, the overlap portion of the insulator layer 9 with the main electrode portion 71 and the main electrode portion 85 and the overlap portion of the insulator layer 9 with the main electrode portion 81 and the main electrode portion 75 become the regions substantially producing the capacitance components. Therefore, the feedthrough capacitor of the third embodiment has two types of regions substantially producing the capacitance components.

The feedthrough capacitor of the third embodiment also successfully achieves the reduction in ESL of the feedthrough capacitor for the same reason as in the case of the feedthrough capacitor C1 of the first embodiment. It can also prevent the reduction in the wiring density possibly occurring in mounting of the feedthrough capacitor of the third embodiment.

The feedthrough capacitor of the third embodiment has the two types of regions substantially producing the capacitance components, and these two types of regions are connected in parallel. Therefore, the feedthrough capacitor can be obtained with low impedance over a wide band when the capacitances are designed at different values by adjusting the sizes and shapes of these two types of regions.

The above described the preferred embodiments of the present invention, but it should be noted that the present invention does not always have to be limited to the above-described embodiments and can be modified in many ways without departing from the scope and spirit of the invention.

For example, the shapes and numbers of the various signal internal electrodes and ground internal electrodes, the forming positions of the lead portions, etc. are not limited to those in the above embodiments. The above-described embodiments were the examples with the four ground terminal electrodes 13-16, but the number of ground terminal electrodes is not limited to it; the feedthrough capacitor may be arranged with at least one of the four ground terminal electrodes 13-16. For example, the feedthrough capacitor may be provided with only the first and second ground terminal electrodes 13, 14 or with only the first and fourth ground terminal electrodes 13, 16.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A feedthrough capacitor comprising:
a capacitor element body of a substantially rectangular parallelepiped shape in which a plurality of insulator layers are laminated together;
a signal internal electrode and a ground internal electrode arranged in the capacitor element body and facing each other;
signal terminal electrodes provided on first and second end faces, respectively, in a longitudinal direction of the capacitor element body and connected to the signal internal electrode; and
ground terminal electrodes provided on first and second side faces, respectively, of the capacitor element body, extending along the longitudinal direction of the capacitor element body and facing each other, said ground terminal electrodes being connected to the ground internal electrode,
wherein the ground terminal electrodes comprise first and second ground terminal electrodes on the first side face, the first ground terminal electrode located closest to the first end face on the first side face, the second ground terminal electrode located closest to the second end face on the first side face, and third and fourth ground terminal electrodes on the second side face, the third ground terminal electrode located closest to the first end face on the second side face, and the fourth ground terminal electrode located closest to the second end face on the second side face,
wherein, when viewed from a direction perpendicular to the first side face, a distance between the first ground terminal electrode and second ground terminal electrode is longer than a distance between the first ground terminal electrode and the first end face and a distance between the second ground terminal electrode and the second end face,
wherein, when viewed from a direction perpendicular to the second side face, a distance between the third ground terminal electrode and fourth ground terminal electrode is longer than a distance between the third ground terminal electrode and the first end face and a distance between the fourth ground terminal electrode and the second end face, and wherein none of terminal electrodes are arranged on a region located between the first and third ground terminal electrodes and the second and fourth ground terminal electrodes in the capacitor element body.

2. The feedthrough capacitor according to claim 1, comprising a plurality of said ground internal electrodes,
   wherein at least two ground internal electrodes out of the plurality of ground internal electrodes are connected to different ground terminal electrodes out of the ground terminal electrodes.

3. The feedthrough capacitor according to claim 2, comprising a plurality of said signal internal electrodes,
   wherein at least one signal internal electrode out of the plurality of signal internal electrodes and at least one ground internal electrode out of the plurality of ground internal electrodes are arranged on the same layer.

4. A mounted structure of a feedthrough capacitor comprising:
   the feedthrough capacitor as set forth in claim 1; and
   a circuit board having a conductor wire formed on a surface thereof, wherein the conductor wire is not connected to the signal terminal electrodes and ground terminal electrodes, and
   wherein the feedthrough capacitor is arranged above the conductor wire so that a longitudinal direction of the feedthrough capacitor intersects with an extending direction of the conductor wire.

5. The mounted structure of the feedthrough capacitor according to claim 4,
   wherein the feedthrough capacitor has the ground terminal electrode located nearer the first end face and the ground terminal electrode located nearer the second end face, on at least one side face out of the first to fourth side faces, and
   wherein when viewed from a laminate direction of the insulator layers, a region located between the first and third ground terminal electrodes located nearer the first end face and the second and fourth ground terminal electrodes located nearer the second end face in the feedthrough capacitor is arranged above the conductor wire.

* * * * *